United States Patent [19]
Brown

[11] Patent Number: 5,633,905
[45] Date of Patent: May 27, 1997

[54] THREE PHASE CLOCKING FOR AN IC SHIFT REGISTER AT THE END OF A LONG SERIAL DATA PATH

[75] Inventor: Richard R. Brown, Colorado Springs, Colo.

[73] Assignee: Hewlett-Packard Company, Palo Alto, Calif.

[21] Appl. No.: 667,156

[22] Filed: Jun. 20, 1996

[51] Int. Cl.$^6$ .................................................. G11C 19/00
[52] U.S. Cl. .................. 377/54; 377/78; 377/80
[58] Field of Search .................. 377/54, 68, 78, 377/80

[56] References Cited

U.S. PATENT DOCUMENTS 5,306,962  4/1994  Lamb ........................ 377/78

*Primary Examiner*—Margaret Rose Wambach
*Attorney, Agent, or Firm*—Edward L. Miller

[57] ABSTRACT

Within an integrated circuit a source of digital data is coupled to a distant destination by a serial data path that is characterized by being either an imperfect and lossy transmission line or as possessing significant high frequency attenuation. A single phase clock accompanies the data over the serial data path. A single phase to three phase clock generator at the destination creates the three phase clock. If the destination is a shift register, then the three phase clock can be used for stage-to-stage clocking within the shift register, as well as for getting data into the input bit of the shift register.

3 Claims, 3 Drawing Sheets

THREE PHASE CLOCKING FOR AN IC SHIFT REGISTER AT THE END OF A LONG SERIAL DATA PATH

BACKGROUND OF THE INVENTION

Even though integrated circuits are commonly thought of a being "small" in the ordinary sense of the term, there is another sense in which the distance from one side to another of a chip can be thought of as being a long distance indeed. Some of the driving forces behind today's modern complicated LSI IC's are that device geometry has gotten small while process yield has gone up, allowing an increase in die size. These trends combine to allow the production of very complicated mechanisms on a single die. The shrinking of device geometries has been accompanied by an increase in operating speed, even though power levels have also decreased. As a consequence, today's IC designers must cope with circumstances where they are forced to choose among trade-offs that relate power dissipation, speed and distance. That is, to get a set of high speed signals from one side of the chip to the other may require either greater amounts of silicon real estate for high power drivers or a reduction in operating speed.

In some cases the nature of the function the IC is to perform lends itself to another solution. Let's say that the IC is to operate upon a set of data, and that the data needs to be at more than one place on the chip. Often, the data can be serialized and sent across the chip to a shift register. Once in the shift register, the data may be shifted out as needed if continued serial use is desired, or it may be taken out "sideways" as parallel data. This mode of data transport has the advantage that only the clocking signal(s) and the serial data line need be routed across the distance to be covered.

Alas, genuine transmission lines (i.e., ones that sustain propagation of electromagnetic radiation without radiating it and with negligible dissipation) can be difficult to fabricate, and depending upon the IC process at hand, may not even be available. The result is that the pathways for clock signals and data from the source to the destination often look more like low pass filters than transmission lines. This slows up the edges of fast clock and data signals, and can require the lowering of data rates to ensure reliable operation. Thus, while the rest of the chip might operate at 50 or 100 MHz, the serial data path could be restricted to limping along at 10 or 20 MHz. It would be desirable if there were a way to cope with such lossy transmission lines and despite them, boost the data rates over such a serial path to a destination.

SUMMARY OF THE INVENTION

A solution to the problem of lossy and imperfect transmission lines coupling serial data from a source to a destination is to incorporate a three phase clock into the destination. A single phase clock may accompany the data over the serial data path. A single phase to three phase clock generator at the destination creates the three phase clock. If the destination is a shift register, then the three phase clock can be used for stage-to-stage clocking within the shift register, as well as for getting data into the input bit of the shift register.

DESCRIPTION OF A PREFERRED EMBODIMENT

Figure 1:
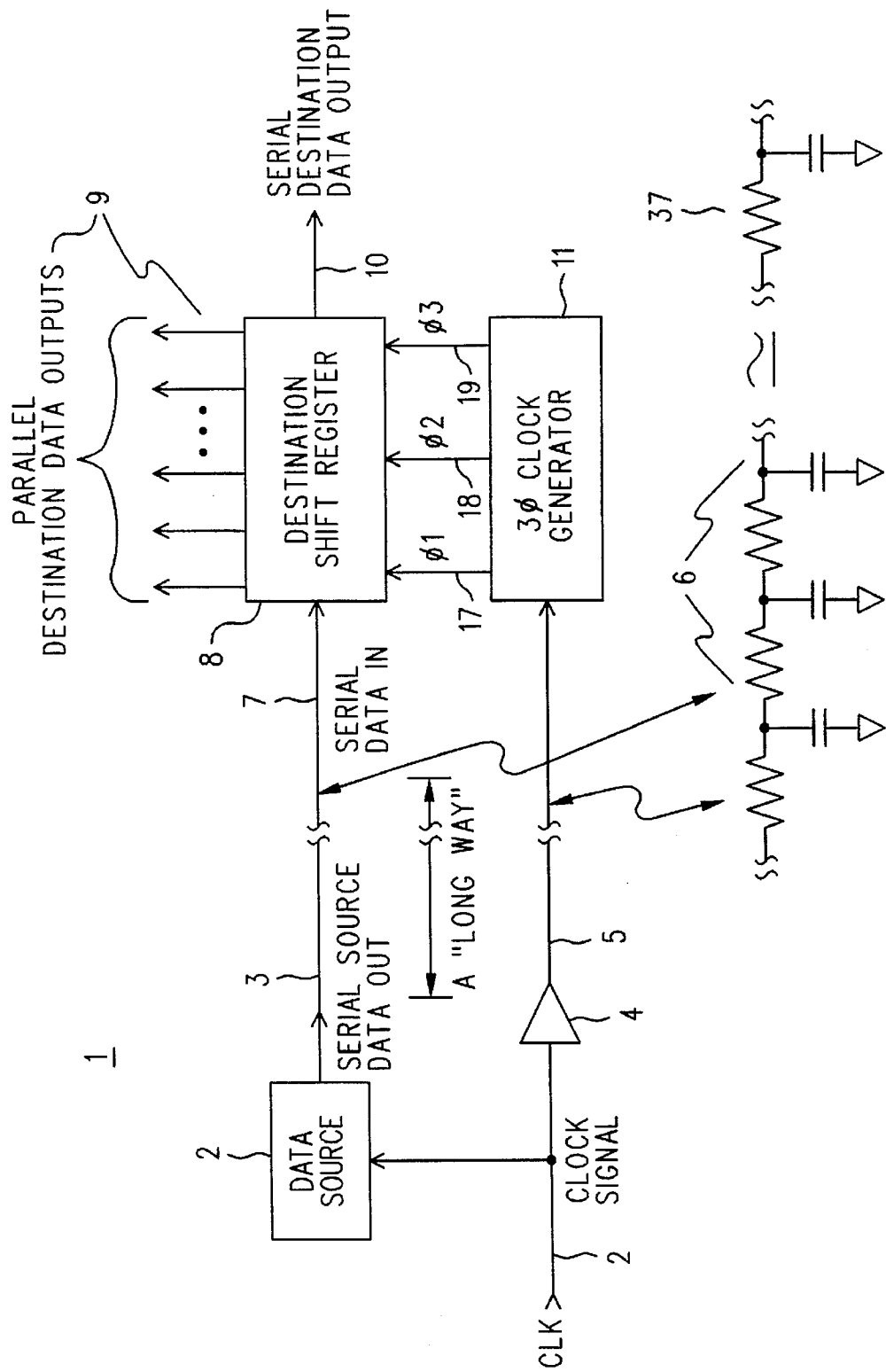
FIG. 1 is a simplified block diagram of a portion on an integrated circuit constructed in accordance with the invention.

Refer now to FIG. 1, wherein is shown a simplified block diagram 1 of a portion of an integrated circuit constructed in accordance with the invention. In the figure, a data source 2, which may be a shift register, operates in conjunction with a clock signal CLK 2 to produce a signal SERIAL SOURCE DATA OUT 3. The signal CLK 2 may be buffered by a driver 4, if desired, and the pair of signals SERIAL SOURCE DATA OUT 3 and (possibly buffered) CLK 5 are applied to the input ends of "long" and imperfect lossy transmission lines whose equivalent circuits (6, 37) are a lumped approximation of distributed series resistance and shunt capacitance. For example, such an imperfect and lossy transmission line might have a width of 1.2 μM and a length (including meanders) of 20,000 μM, an effective series resistance of about 830 ohms and an effective shunt capacitance of 7.5 pFd. At a distal end of the imperfect lossy transmission lines the clock signal 5 is applied to a three phase clock generator circuit 11. The SERIAL SOURCE DATA OUT signal 3 becomes the signal SERIAL DATA IN 7 at a destination shift register 8. The destination shift register 8 accepts as data SERIAL DATA IN 7 in accordance with three phases of clock signals φ1 (17), φ2 (18) and φ3 (19) that are produced by the 3φ clock generator 11. Output data from the destination shift register 8 may be available either (as parallel data) at PARALLEL DESTINATION DATA OUTPUTS 9 or (as serial data) at SERIAL DESTINATION DATA OUTPUT 10.

Figure 2:
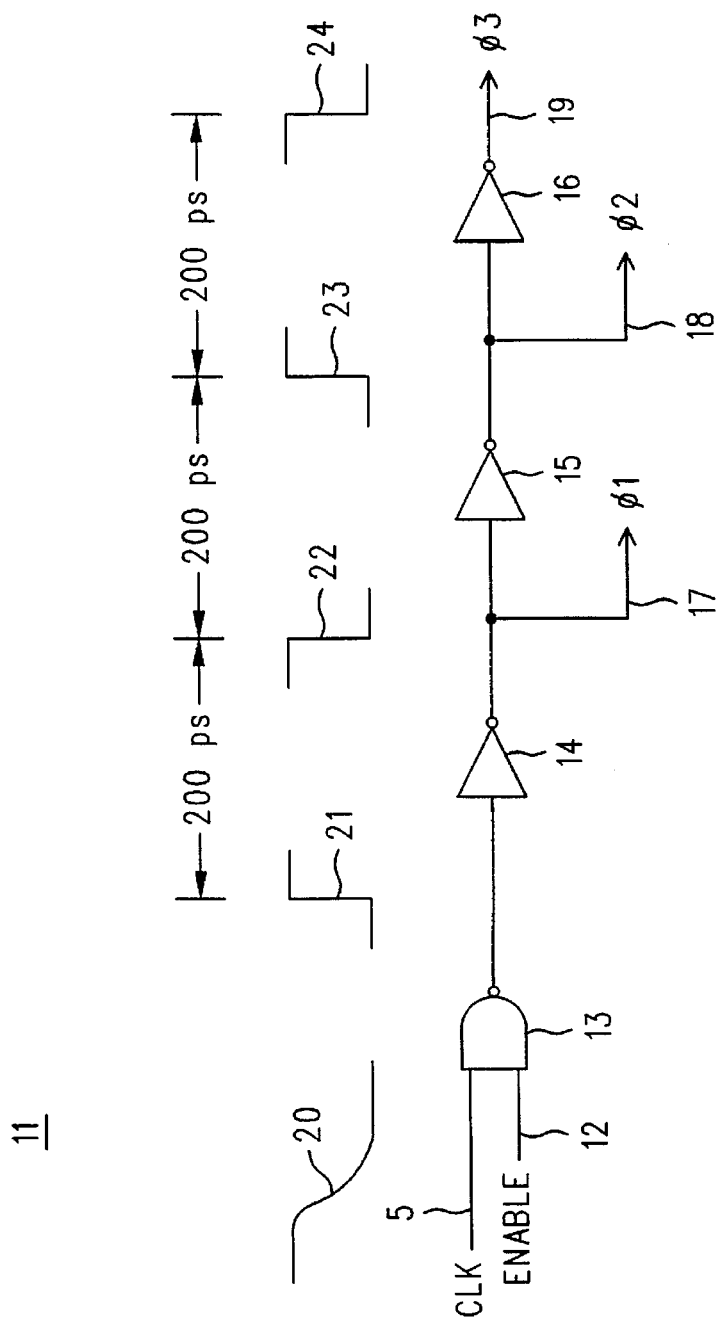
FIG. 2 is a simplified schematic segment of the 3φ, clock generator of FIG. 1.

Refer now to FIG. 2, wherein is shown a simplified schematic diagram 11 of a single phase to three phase clock generator circuit. The single phase clock signal to be converted is the signal CLK 5. It is applied as one input of a NAND gate 13 whose other input is a signal ENABLE 12. The signal ENABLE 12 is true whenever the single phase to three phase conversion is desired, such as clocking data in or out of the destination shift register 8. At other times ENABLE is false. ENABLE is allowed to transition only at times when CLK 5 is low, lest there be a glitch in the chain of phased clock signals 17–19 discussed below.

As seen in the figure, the three phase clock generator 11 may be a cascaded series of three inverters, 14, 15 and 16. In one particular and preferred embodiment the delay through each of these inverters is 200 ps. The output 17 of inverter 14 is a clock signal φ1. The signal 17 φ1 is used as one of three 3φ clock signals, as well as being applied as the input to the next inverter 15 in the cascaded chain thereof. The output 18 of inverter 15 is a clock signal φ2. The signal 18 is also used as one of the 3φ, clock signals, as well as being applied as the input to the last inverter 16. Its output 19 is the final 3φ, clock signal φ3.

Also included in FIG. 2 are some waveforms indicating the direction of signal transitions during the onset of an individual clock signal cycle. The applied single phase clock signal 5 goes negative with a deteriorated fall time; see waveform 20. NAND gate 13 shortens the transition time and inverts the direction of transition; see waveform 21. Also, notice the indicated edge to edge delays of 200 ps. Finally, the three clock signals 17, 18 and 19 are overlapping. That is, about 400 ps after φ1 17 transitions as part of a half-cycle in a given direction, φ3 19 will transition in the same direction as part of its representation of that half-cycle, and all three clock signals will remain steady at their appropriate half-cycle values until a transition in the opposite direction occurs for the next half-cycle.

Figure 3:
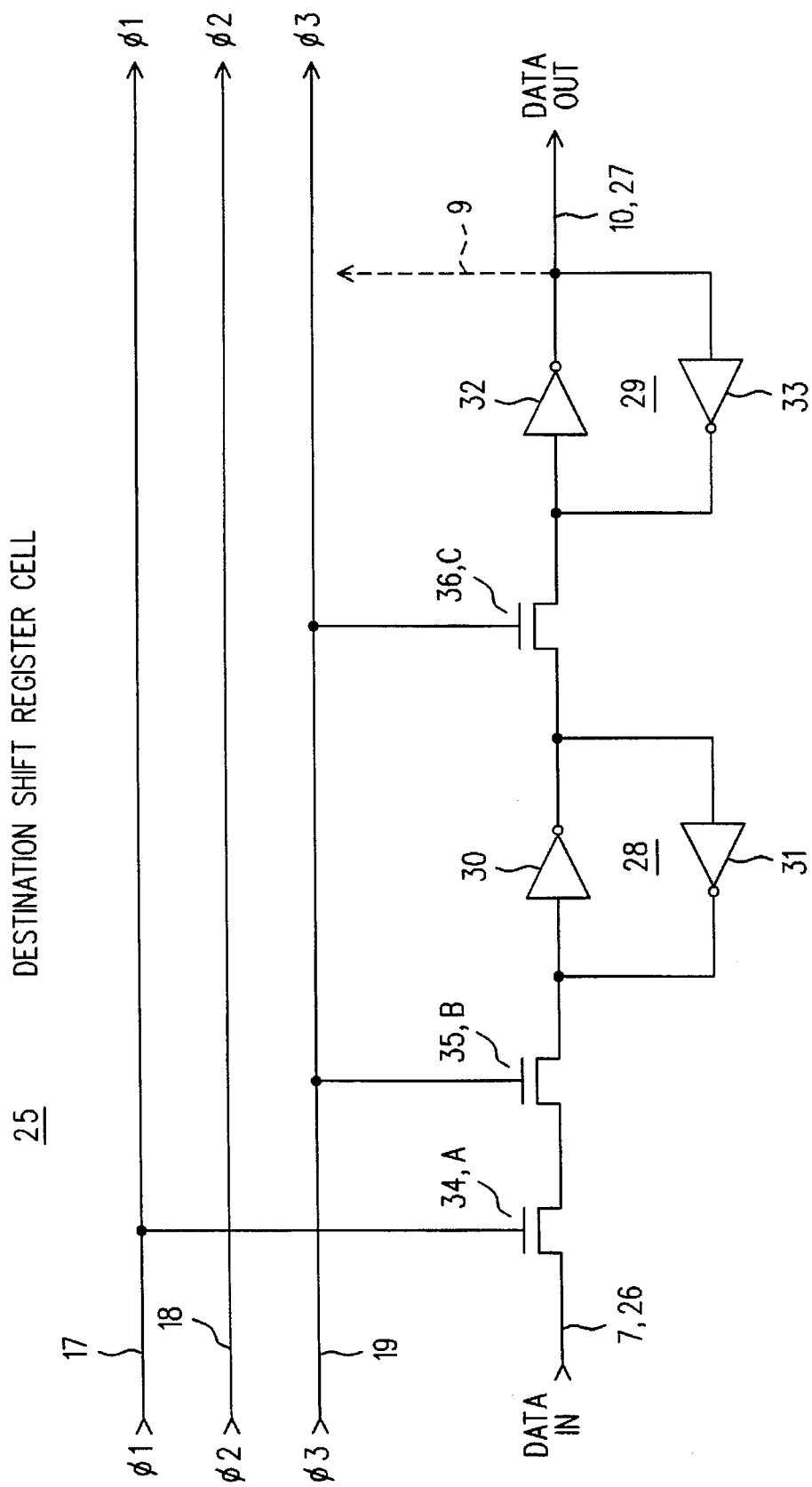
FIG. 3 is a simplified schematic segment of a shift register cell in the destination shift register of FIG. 1.

Refer now to FIG. 3, wherein is shown a simplified schematic of a typical cell 25 of the destination shift register 8. The destination shift register 8 includes an ordered plurality of such cells 25. Note that the three phases of the three phase clock (φ1—17, φ2—18 and φ3—19) are supplied to and used by the cell 25. The cell 25 includes two latches (28, 29) each of which is formed from a pair of inverters that are weakly coupled from the output of each one to the input of the other one. Latch 28 is formed of inverters 30 and 31; observe that the output of latch 30 is coupled to the input of latch 31, whose output is in turn coupled to the input of latch 30. Latch 29 is similarly formed of inverters 32 and 33.

Latch 28 is set or cleared according to the value of the signal DATA IN (7, 26) after that value passes through gate 34 (a switch "A", controlled by φ1—17) and through gate 35 (a switch "B", controlled by φ3—19). Similarly, gate 36 (a switch "C", controlled by φ2—18) couples the output of latch 28 (i.e., the output of inverter 30) into latch 29 (i.e., the input of inverter 32). The output of inverter 32 is the output of latch 29, and is also the source of the signal DATA OUT (10, 27). It is also part of the collection of signals PARALLEL DESTINATION DATA OUTPUTS 9.

Bear in mind that the cell 25 is representative of all the cells in the destination shift register 8. There may be minor differences from cell to cell, based on some special function or other considerations. If serial operation were the only mode of operation desired, then there would be one "external" DATA IN (7, 26) located at the input of the input cell and one DATA OUT (10, 27) located at the output of the output cell, with all other instances of a DATA OUT being "internally" coupled to the neighboring ("next") instance of DATA IN. For parallel data output the various instances of the DATA OUT's would additionally be made available (as output 9) to the appropriate circuits.

Here now, and with reference to FIGS. 2 and 3, is a description of how data moves through the latches 28 and 29 of cell 25 under the control of the three phase clocks 17, 18 and 19. Just prior to and also upon the arrival at gate 13 of a clock edge 20 of CLK 5 for which DATA IN (7, 26) is to be latched into latch 28 (and thence into latch 29), FET's 34 (switch A) and 35 (switch B) are on and FET 36 (switch C) is off. After a delay of 200 ps A turns off, after another 200 ps C turns on. After still another 200 ps B turns off. The effect of this "clock arrival" sequence ("leading edge" of the clock) is to have the latch 28 driven by, and assume the value of, DATA IN (7, 26), up until "arrival", at which time latch 28 is disconnected from DATA IN by the turning off of switch A. AFTER switch A is turned off then switch C is turned on; this lets the data captured in latch 28 begin to transfer through to latch 29. The turning off of switch B is in preparation for the next, or "clock departure" sequence (during the "trailing edge" of the clock).

Just prior to and also upon the arrival at gate 13 of the trailing edge, switches A and B are both off and switch C is on. After 200 ps switch A turns on, and after an additional 200 ps switch C turns off. After still another 200 ps switch B turns on. The effect of this "departure sequence" is to disconnect the input of latch 29 from the output of latch 28 BEFORE the input of latch 28 is fully reconnected to DATA IN.

I claim:

1. An integrated circuit comprising:

a source of digital data and an associated original clock signal both located within a first location within the integrated circuit;

a shift register located at a second location within the integrated circuit that is distant from the first location and that has a data input for receiving digital data and that also has respective inputs for receiving first, second and third phased clock signals;

a digital data path coupling the source of digital data to the data input of the shift register;

a three phase clock circuit located proximate the shift register and having a clock input for receiving the original clock signal, and also having first, second and third phased clock signal outputs at which are produced respective first, second and third phased clock signals coupled to the shift register, a transition in the original clock signal producing a subsequent delayed transition in the first phased clock signal, a subsequent doubly delayed transition in the second phased clock signal and a subsequent doubly delayed transition in the third phased clock signal, these subsequent transitions in the first and third phased clock signals being in the same direction and opposite that in the second phased clock signal, and each of these subsequent transitions being in their respective opposing directions when the transition in the original clock signal is in its opposite direction; and an original clock signal path coupling the original clock signal to the clock input of the three phase clock circuit.

2. A circuit as in claim 1 wherein the shift register further comprises:

an ordered plurality of cells each of which includes an input latch and an output latch, each such latch having an input and an output;

for each cell in the ordered plurality thereof, first and third switches being in series with each other and their series combination being in series between data to be loaded into the cell and the input of the input latch, the first and third switches respectively coupled to and responsive to the first and third phased clock signals;

a second switch coupling the output of the input latch to the input of the output latch, the second switch coupled to and responsive to the second phased clock signal; and the data to be loaded into a first cell in the ordered plurality thereof being that at the data input of the shift register, and the data to be loaded into a subsequent cell being the output of the output latch for the preceding cell in the ordered plurality thereof.

3. A circuit as in claim 1 wherein the three phase clock circuit comprises a series of cascaded first, second and third inverters and further wherein the first, second and third phased clock signals are the respective outputs of these inverters.

* * * * *